United States Patent [19]

Imai

[11] Patent Number: 5,633,698
[45] Date of Patent: May 27, 1997

[54] EXPOSURE APPARATUS

[75] Inventor: Yuji Imai, Saitama-ken, Japan

[73] Assignee: Nixon Corporation, Tokyo, Japan

[21] Appl. No.: 549,118

[22] Filed: Oct. 27, 1995

[30] Foreign Application Priority Data

Dec. 12, 1994 [JP] Japan .................... 6-307613

[51] Int. Cl.$^6$ .................... H01L 21/30; G03B 27/58; G03B 27/42
[52] U.S. Cl. .................... 355/72; 355/53; 355/55; 355/73
[58] Field of Search .................... 250/548; 356/363, 356/375, 400, 401; 355/50, 52, 53, 55, 72, 76, 77

[56] References Cited

U.S. PATENT DOCUMENTS

| | | | |
|---|---|---|---|
| 4,650,983 | 3/1987 | Suwa | 250/284 |
| 4,786,947 | 11/1988 | Kosugi et al. | 355/30 |
| 5,383,217 | 1/1995 | Uemura | 372/58 |
| 5,392,120 | 2/1995 | Kamiya | 356/358 |
| 5,550,633 | 8/1996 | Kamiya | 356/358 |
| 5,569,930 | 10/1996 | Imai | 250/559.4 |

*Primary Examiner*—Matthew S. Smith
*Assistant Examiner*—Herbert V. Kerwer
*Attorney, Agent, or Firm*—Armstrong, Westerman, Hattori, McLeland & Naughton

[57] ABSTRACT

An exposure apparatus comprises a substrate holding portion for holding a photosensitive substrate including a surface, a substrate stage for two-dimensional positioning of the photosensitive substrate via the substrate holding portion, the substrate stage including an upper surface, and an exposure system for transferring a pattern on a mask to the photosensitive substrate by an exposing illumination light. The substrate holding portion is provided in the substrate stage so that the portion of the upper surface of the substrate stage surrounding the photosensitive substrate is substantially flush with the surface of the photosensitive substrate.

14 Claims, 4 Drawing Sheets

EXPOSURE APPARATUS

BACKGROUND OF THE INVENTION

1. Field of the Invention

The present invention relates to an exposure apparatus used when semiconductors, liquid crystal display elements and the like are manufactured, and more particularly to that preferably applicable to a project exposure apparatus in which the surface of a photosensitive substrate is aligned with the image plane of a projection optical system by means of an AF sensor of an obliquely incident type to perform exposure.

2. Related Background Art

In manufacturing semiconductor elements or the like, there have been used projection exposure apparatuses such as steppers wherein a miniature pattern image of a reticle as a mask is projected and transferred to each of shot areas on a wafer (or a glass plate or the like) on which a photoresist is coated. The conventional projection exposure apparatus includes a wafer stage for sequential and rapid positioning of the shot areas on a wafer to an exposure filed, which wafer is stably held on the wafer stage.

FIG. 4 shows the upper construction of the conventional wafer stage. In FIG. 4, a wafer 1 has a photoresist coated thereon. A circular wafer holder 2 includes on the surface thereof straight line-like convex portions 3A–3E which are parallel to each other. The wafer 1 is held on the convex portions 3A–JE of the wafer holder 2 by vacuum suction. The wafer holder 2 is fixedly mounted on the upper surface of a Z-stage 4. The Z-stage 4 is rested on a Y-stage 5 for slidable movement of the Z-stage 4 relative to the Y-stage 5 along a guide (not shown). The convex portions 3A–3E provided on the upper surface of the wafer holder 2 are formed with vents for serving vacuum suction.

The Z-stage 4 and the Y-stage 5 include inclined contact portions which come into contact with each other. Sliding of the Z-stage 4 relative to the Y-stage 5 in an X-direction permits the height of the upper surface of the Z-stage 4 (or the position of the Z-stage 4 in a Z-direction) to be changed. The Y-stage 5 is movably rested on an X-stage (not shown) for movement of the Y-stage 5 relative to the X-stage in a Y-direction. The movement of the X-stage and the Y-stage 5 allows the Z-stage 4 to be positioned in the directions of X and Y. The Z-stage includes therein a θ table for rotating the wafer holder 2, a leveling table for adjusting the oblique angle of the wafer 1, and so on. The θ table and the leveling table are not shown in FIG. 4. The wafer stage comprises the Z-stage 4, the Y-stage 5, the X-stage, and so on.

A reference mark member 8 is fixedly mounted on the upper surface of the Z-stage 4 closely to the wafer holder 2. A shift mirror 10X for an X-axis and a shift mirror 10Y for a Y-axis are fixedly mounted on the upper surface of the Z-stage 4 outside of the reference mark member 8. A laser beam for measurement is supplied from a laser interferometer 11X which is provided outside of the wafer stage to the shift mirror 10X. Two laser beams are supplied from a laser interferometer 11Y to the shift mirror 10Y. Two-dimensional coordinates (X, Y) of the Z-stage 4 are determined by a value measured by the laser interferometer 11X and an average of two values measured by the laser interferometer 11Y. A rotation angle of the Z-stage 4 is obtained from a difference between the two values measured by the laser interferometer 11Y. The reference mark member 8 includes on the surface thereof a shading film which has provided therein a reference mark 9Y comprising a slit-shaped opening extending in the X-direction and a reference mark 9X comprising a slit-shaped opening extending in the Y-direction. The illumination of the reference marks 9X and 9Y from the bottom side thereof allows alignment of a reticle (not shown) to be performed on the basis of the reference marks 9X and 9Y. Each of the reference marks 9X and 9Y is referred to as "a light-emitting mark".

In FIG. 4, a predetermined shot area of the wafer area is positioned within an exposure field 6 of a projection optical system (not shown). A slit image 7 from an illumination optical system of an AF sensor (not shown) of an obliquely incident type (a focus position detecting system) is obliquely projected onto a measurement point at the center of the exposure field 6. A reflection light from the measurement point is re-focused within a light-receiving optical system of the AF sensor of an obliquely incident type. The position of the measurement point in the Z-direction (or a focus position) is determined from a value of lateral deviation of the re-focused position. Movement of the Z-stage 4 in the Z-direction to align the focus position with the position of the image plane allows auto-focusing to be effected.

In the conventional projection exposure apparatus, the wafer holder 2, the reference mark member 8, and the shift mirrors 10X and 10Y are fixedly mounted on the Z-stage 4 at the upper side of the wafer stage to protrude therefrom. The projection exposure apparatus is located within a chamber in which clean air the temperature of which is normally adjusted to be constant is circulated. Thus the upward protrusion of the above elements from the wafer stage causes air flow turbulence, thereby adversely affecting the focus quality of the projection optical system.

Similarly, in the AF sensor of an obliquely incident type in which a slit image or the like is obliquely projected within the exposure field 6 of the projection optical system, fluctuation of the wavefront of focus-detecting luminous flux caused by air flow turbulence above the wafer stage results in a slit image re-focused within the light-receiving optical system being unclear, thereby reducing accuracy when detecting a focus position.

SUMMARY OF THE INVENTION

An object of the present invention is to provide an exposure apparatus for decreasing gas flow turbulence above a stage on which a photosensitive substrate is rested, thereby enabling a satisfactory quality in focussing to be obtained.

Another object of the present invention is to provide an exposure apparatus for detecting a focus position of a photosensitive substrate by an AF sensor of an obliquely incident type in which the turbulence of detecting luminous flux can be decreased to thereby enhance accuracy when detecting a focus position.

The present invention provides an exposure apparatus comprising: a substrate holding portion for holding a photosensitive substrate including a surface; a substrate stage for two-dimensional positioning of the photosensitive substrate via the substrate holding portion, the substrate stage including an upper surface; and an exposure system for transferring a pattern on a mask to the photosensitive substrate by an exposing illumination light, the substrate holding portion being provided in the substrate stage so that the portion of the upper surface of the substrate stage surrounding the photosensitive substrate is substantially flush with the surface of the photosensitive substrate.

According to one embodiment of the present invention, the substrate holding portion is embedded in the upper surface of the substrate stage.

According to another embodiment of the present invention, the substrate stage includes an X and Y stage for two-dimensional positioning of the photosensitive substrate and a Z-stage for positioning the photosensitive substrate in a vertical direction, the Z-stage includes an upper surface, and the substrate holding portion is embedded in the upper surface of the Z-stage.

According to another embodiment of the present invention, the substrate stage includes on the upper surface thereof a recess, and the substrate holding portion is mounted into the recess.

According to another embodiment of the present invention, the substrate stage includes a substrate stage body and a cover member mounted on the substrate body, the cover member includes a surface for constituting the upper surface of the substrate stage and an opening at the portion thereof facing to the substrate holding portion, the photosensitive substrate is held through the opening of the cover member by the substrate holding portion, and the surface of the cover member is substantially flush with the surface of the photosensitive substrate when the substrate is held by the holding portion.

According to another embodiment of the present invention, the substrate stage further includes a pair of mirrors for measuring a position of the substrate stage, the mirrors include upper surfaces, and the mirrors are mounted on the substrate stage so that the upper surface of the substrate stage is substantially flush with the upper surfaces of the mirrors.

According to another embodiment of the present invention, the substrate stage includes cutout portions, and the mirrors are mounted on the cutout portions.

According to another embodiment of the present invention, the substrate stage includes a reference mark member used for alignment, the reference mark member includes a surface, and the reference mark member is mounted on the substrate stage so that the surface of the reference mark member is substantially flush with the upper surface of the substrate stage.

According to another embodiment of the present invention, the substrate stage includes a recess on the portion thereof adjacent to the substrate holding portion, and the reference mark member is mounted on the recess of the substrate stage.

According to another embodiment of the present invention, the substrate stage further includes a pair of mirrors for measuring a position of the substrate stage and a reference mark member used for alignment, the mirrors include upper surfaces, the reference mark member includes a surface, and the mirrors and the reference mark member are mounted on the substrate stage so that the upper surfaces of the mirrors, the surface of the reference mark member, and the upper surface of the substrate stage are substantially flush with each other.

According to another embodiment of the present invention, the exposure apparatus further comprises a gas supplying system for supplying to the substrate stage a gas the temperature of which is adjusted to be constant and the wind velocity distribution of which is made uniform.

According to another embodiment of the present invention, the exposure apparatus further comprises a gas supplying device for supplying a gas to the substrate stage, a temperature adjusting device for adjusting the temperature of the gas to be constant, and a device for making the wind velocity distribution of the gas uniform, whereby the gas the temperature of which is adjusted to be constant and the wind velocity distribution of which is made uniform is supplied to the substrate stage.

According to another embodiment of the present invention, the exposure apparatus further comprises a first cylinder for conducting the gas supplied from the gas supplying device to the substrate stage.

According to another embodiment of the present invention, the exposure apparatus further comprises a second cylinder for conducting the gas passing over the substrate stage away from the substrate stage.

The present invention provides an exposure apparatus comprising: a projection optical system for projecting the image of a mask pattern onto a photosensitive substrate, the projection optical system including an optical axis; a substrate stage for controlling a position of the photosensitive substrate relative to the optical axis of the projection optical system; an illumination optical system for projecting obliquely relative to the optical axis of the projection optical system a focus measuring pattern onto the photosensitive substrate, the illumination optical system including an optical axis; a light receiving system for receiving a light reflected by the photosensitive substrate to create an image of a focus measuring pattern, the light-receiving system including an optical axis; a system for adjusting the position of the photosensitive substrate relative to a direction parallel to the optical axis of the projection optical system via the substrate stage on the basis of a lateral deviation of the focus measuring pattern to be re-focused within the light-receiving system; and a gas supplying system for supplying along the optical axis of the illumination optical system a gas the temperature of which is adjusted to be constant and the wind velocity distribution of which is made uniform.

According to another embodiment of the present invention, the substrate stage includes an upper surface, and the gas supplying system supplies a gas the temperature of which is adjusted to be constant and the wind velocity distribution of which is made uniform between the projection optical system and the substrate stage in a direction along the intersection of a plane including the optical axes of the illumination optical system and the light-receiving system and of the upper surface of the substrate stage.

According to another embodiment of the present invention, the illumination optical system includes a light path, the exposure apparatus further comprises a first cylinder for surrounding a portion of the light path of the illumination optical system, and the gas supplying system supplies the gas into the cylinder.

According to another embodiment of the present invention, the light receiving system includes a light path, and the exposure apparatus further comprises a second cylinder for surrounding a portion of the light path of the light receiving system to conduct the gas passing over the substrate stage through the second cylinder away from the substrate stage.

According to another embodiment of the present invention, the photosensitive substrate includes a surface, the substrate stage includes a substrate holding portion for holding the photosensitive substrate to position the photosensitive substrate via the substrate holding portion, the substrate stage further includes an upper surface, and the substrate holding portion is mounted on the substrate stage so that the upper surface of the substrate stage is substantially flush with the surface of the photosensitive substrate.

According to the present invention, since the surface of the photosensitive substrate held on the substrate holder is substantially flush with the upper surface of the substrate stage surrounding the photosensitive substrate, the upper surface of the substrate stage is substantially flat, thereby enabling the gas passing above the substrate stage to flow without turbulence and allowing the focus quality to be satisfactorily maintained.

If a reference mark member for an alignment, shift mirrors, and so on are mounted on the substrate stage, making the surfaces of the reference mark member and the shift mirrors substantially flush with the upper surface of the substrate stage permits an air flow to be made more uniform.

When the gas supplying system supplies to the substrate stage a gas the temperature of which is adjusted to be constant and the wind velocity distribution of which is made uniform, the gas flows in a predetermined direction without turbulence above the substrate stage, thereby enabling a satisfactory quality in focussing to be maintained.

According to the present invention, since a gas the temperature of which is adjusted to be constant and the wind velocity distribution of which is made uniform is supplied along the optical axis of the illumination optical system constituting a focus position detecting system of an obliquely incident type (or an AF sensor), a refractive index distribution of an area through which a detecting luminous flux passes is made uniform and stable, thereby preventing turbulence in the detecting luminous flux and increasing precision in the detection of a focus position.

DETAILED DESCRIPTION OF THE PREFERRED EMBODIMENTS

Figure 4:
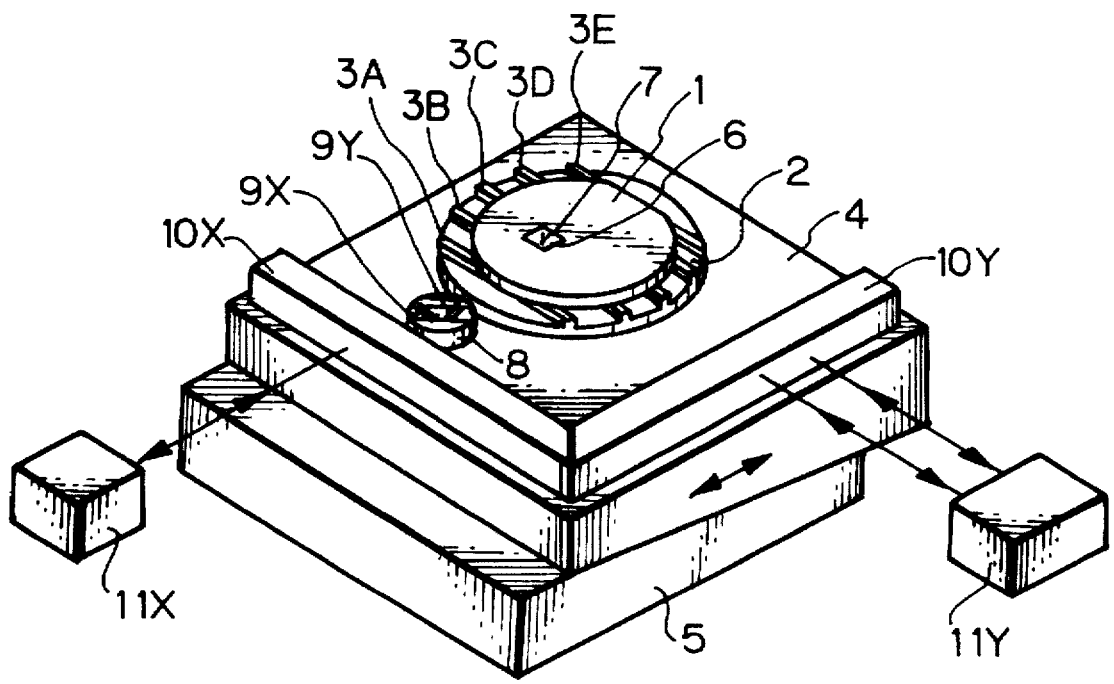
FIG. 4 is a perspective view showing the upper construction of the wafer stage in the conventional art.
Figure 4:
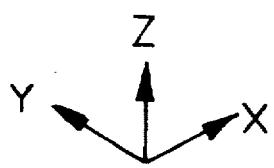

An exposure apparatus according to a preferred embodiment of the invention will be explained with reference to FIGS. 1 and 2. In this embodiment, the present invention is applied to a projection exposure apparatus including an AF-sensor of an obliquely incident type. Elements which the preferred embodiment and the conventional exposure shown in FIG. 4 share have been allocated the same reference numeral.

Figure 1:
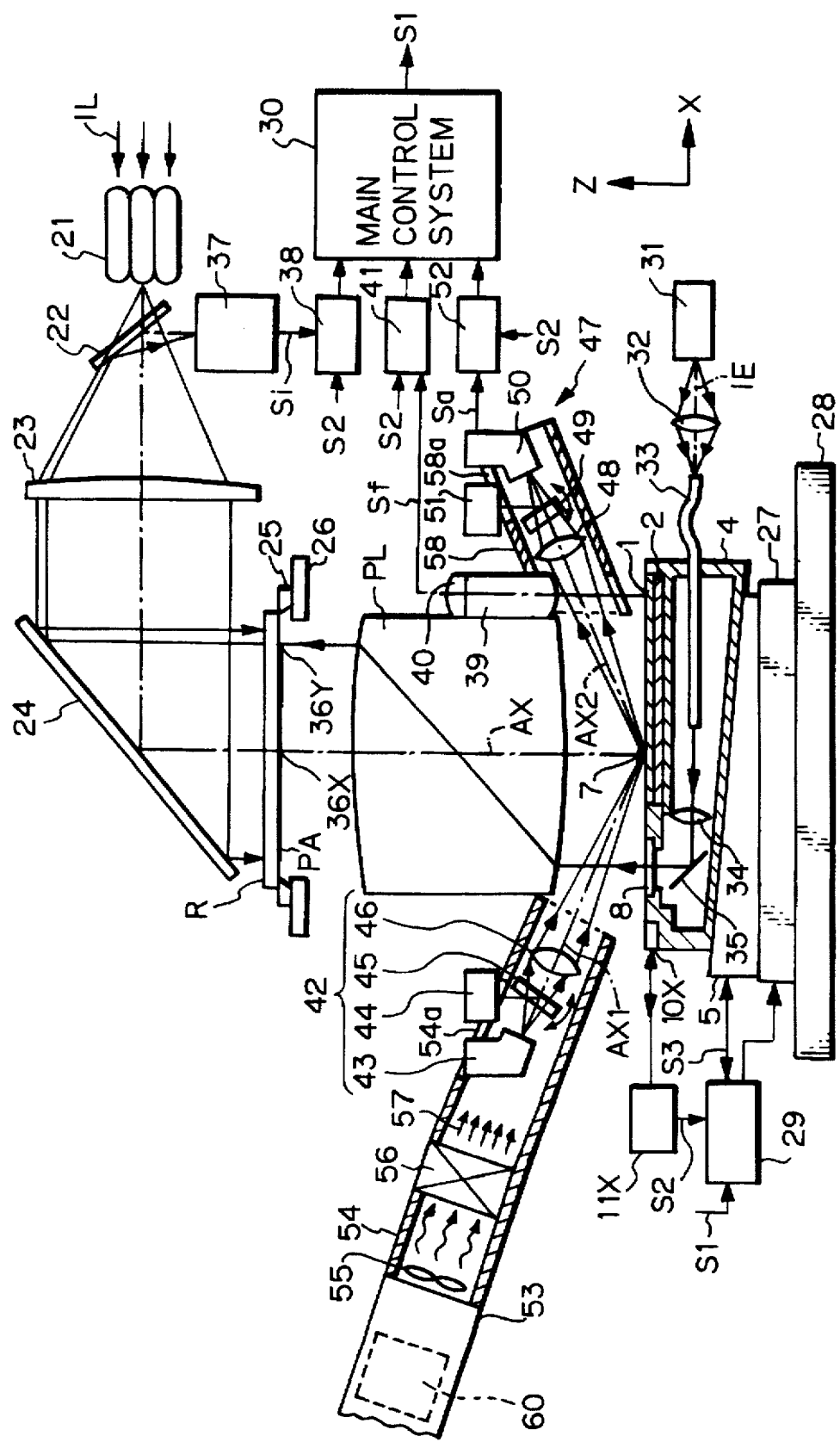
FIG. 1 is a schematic illustration showing an exposure apparatus according to a preferred embodiment of the present invention.

FIG. 1 shows the construction of a main portion of the projection exposure apparatus according to this embodiment. In FIG. 1, an exposing illumination light IL emitted from a light source (not shown) is supplied through a fly eye lens 21. A g-line and i-line emitted from a mercury lamp, an ultraviolet radiation pulse light emitted from an excimer laser light source, and so on can be used as the illumination light IL. The fly eye lens 21 includes at its emitting side a focus surface having many light source images. Light respectively emitted from the light source images passes through a beam splitter 22. The transmittance of the beam splitter 22 is high and the reflectance thereof is low. After passing through the beam splitter 22, the illumination light IL passes through a condenser lens 23 and a mirror 24 to illuminate a pattern area PA of a reticle R with a substantially uniform illuminance distribution. The reticle R is held on a reticle stage 26 via a reticle holder 25. The reticle stage 26 enables the reticle R to be positioned within a predetermined range. A laser interferometer (not shown) measures a two-dimensional position and a rotation angle of the reticle stage 26 and the measured value is provided to a main control system 30 for entirely controlling the exposure apparatus.

The illumination light IL passing through a pattern area PA of a reticle R makes the image of the pattern area PA on a wafer 1 via telecentric projection optical system PL at both of reticle and wafer sides or at the wafer side. The wafer 1 is held on a wafer holder 2 by vacuum suction and the wafer holder 2 is embedded in a wafer stage. The wafer stage of the embodiment comprises a Z-stage 4, a Y-stage 5, an X-stage 27, and a base 28. A Z-axis is provided in parallel to the optical axis AX of the projection optical system PL. An X-axis is provided within a plane normal to the Z-axis and in parallel to the plane of FIG. 1 and a Y-axis is provided to be perpendicular to the plane of FIG. 1.

Figure 2:
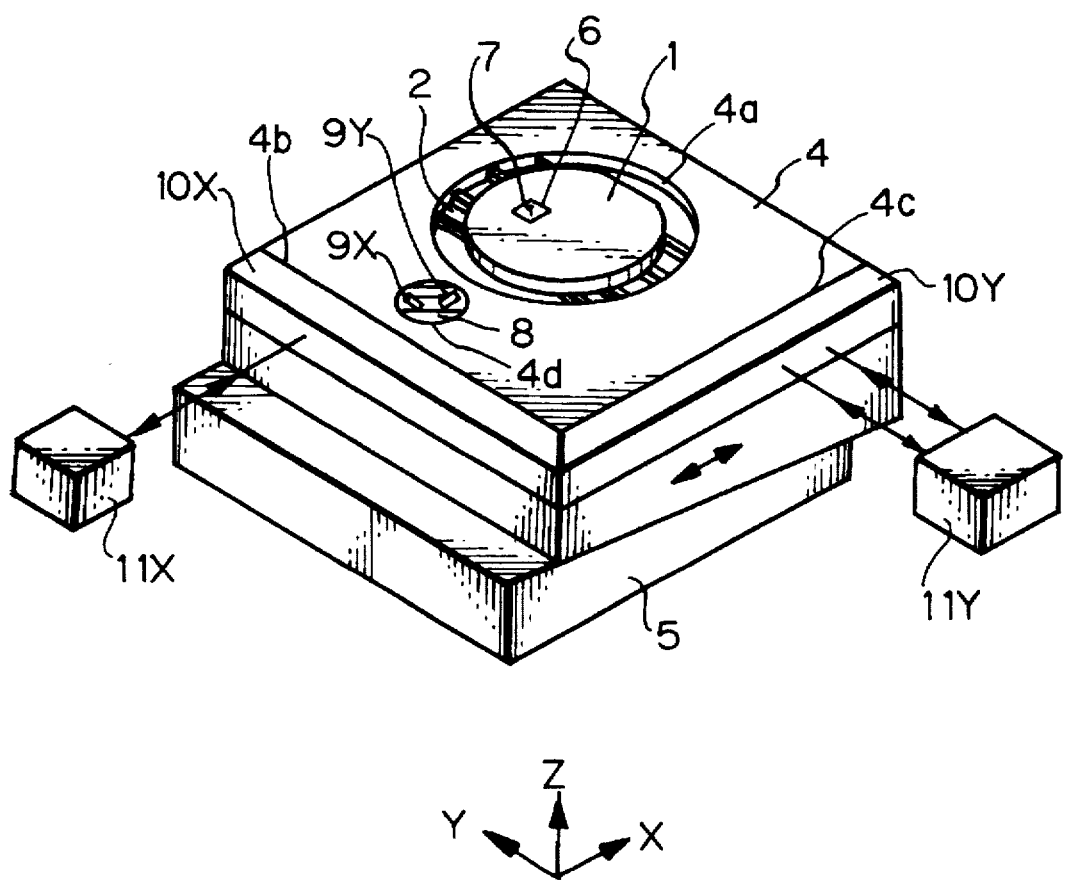
FIG. 2 is a perspective view showing the upper construction of the wafer stage according to a preferred embodiment.

FIG. 2 shows the upper surface of the Z-stage 4. The Z-stage 4 includes a recess 4a on the upper surface thereof. The wafer holder 2 is fixedly mounted within the recess 4a. The surface of the wafer 1 (in the direction of the Z-axis) is flush with the upper surface of the Z-stage 4. A recess 4d is provided in the upper surface of the Z-stage 4 closely to the recess 4a. A reference mark member 8 is provided within the recess 4d. In other words, the reference mark member 8 is embedded in the upper surface of the Z-stage 4 closely to the recess 4a. The surface of the reference mark member 8 is flush with the upper surface of the Z-stage 4. The reference mark member 8 comprises a glass substrate such as quartz. The glass substrate includes on the surface thereof a shading film. Light-emitting marks 9X and 9Y are provided in the shading film.

The Z-stage 4 includes a cutout portion 4b on one side thereof facing to a laser interferometer 11X mentioned below (or at the side thereof in the minus X-direction). A shift mirror 10X for the X-axis is fixedly mounted on the cutout portion 4b. The Z-stage 4 includes a cutout portion 4c on one side thereof facing to a laser interferometer 11Y mentioned below (or at the side thereof in the minus Y-direction). A shift mirror 10Y for the Y-axis is fixedly mounted on the cutout portion 4c. The upper surfaces of the shift mirrors 10X and 10Y are also flush with the upper surface of the Z-stage 4. The laser interferometers 11X and 11Y are arranged to face to the shift mirrors 10X and 10Y, respectively. The laser interferometers 11X and 11Y detect the two-dimensional coordinates (X, Y) and the rotation angle of the Z-stage 4. The Z-stage 4 is rested on the Y-stage 5 for oblique and slidable movement of the Z-stage 4 on the Y-stage 5. The Z-stage 4 can be slidably moved along the Y-stage 5 by means of an internally provided feed screw and a driving motor. The sliding of the Z-stage 4 relative to the Y-stage 5 allows the Z coordinates of the Z-stage 4 to be adjusted. In this case, the relation between the rotation angle of the feed screw and the displacement of the Z-stage 4 in the Z-direction is obtained beforehand. Thus, detecting the rotation angle of the feed screw by a rotary encoder enables the displacement of the Z-stage 4 in the Z-direction to be monitored.

The Z-stage 4 includes therein a leveling stage for controlling the oblique angle of the wafer 1, a θ table for rotating the wafer 1 within a predetermined range, and so on. The construction of the wafer stage in the embodiment is specifically disclosed in U.S. Pat. No. 4,770,531. The apparatus according to the embodiment includes the leveling stage in addition to the Z-stage 4. However, in place of the Z-stage 4 and the leveling stage, a table on which the wafer holder 2 is rested may be disposed on the Y-stage 5 via three piezoelectric elements which can expand and shrink in the Z-direction, thereby independent control of the piezoelectric elements allowing the height of the surface of the wafer 1 (or the position of the wafer in the Z-direction) and the oblique angle of the surface thereof to be adjusted. The construction of a wafer stage of this kind is disclosed in for example U.S. application Ser. No. 363,336 filed on Dec. 23, 1994 by the applicant of this application.

In FIG. 1, the Y-stage 5 is rested on the X-stage 27 to be movable in the Y-direction. The X-stage 27 is rested on the base 28 to be movable in the X-direction. Supplied to a stage-driving system 29 are a position information S2 and a height information S3. The position information S2 indicates the two-dimensional coordinates (X, Y) and the rotation angle of the Z-stage 4 which are measured by the laser interferometers 11X and 11Y. The height information S3 indicates the displacement of the Z-stage 4 in the Z-direction which is supplied from the rotary encoder for detecting the displacement thereof. The stage-driving system 29 controls the position of the X-stage 27 in the X-direction and the position of the Y-stage 5 in the Y-direction on the basis of the control information S1 from the main control system 30 and of the position information S2. The stage-driving system 29 also controls the position of the Z-stage 4 in the Z-direction on the basis of the control information S1 and the height information S3.

In this embodiment, the alignment of the reticle R relative to the wafer stage is performed by a so-called imaging slit sensor system (referred to as an "ISS system" hereinafter). The mechanism will therefore be explained. As shown in FIG. 1, the reticle R includes on the lower surface thereof a pattern area PA. The reticle R also includes on its lower surface an alignment mark 36Y outside of the pattern area PA at a position adjacent to an end of the plus X-direction side of the pattern area PA. The alignment mark 36Y comprises an opening pattern extending in the X-direction. The reticle R also includes on its lower surface an alignment mark 36X outside of the pattern area PA at a position adjacent to an end of the plus Y-direction side of the pattern area PA. The alignment mark 36X comprises an opening pattern extending in the Y-direction. The alignment marks 36X and 36Y are the same size as the conjugate images of the light-emitting marks 9X and 9Y which are projected onto the reticle R by projecting onto the reticle the images of the light-emitting marks 9X and 9Y provided in the reference mark member 8. Intersection of the two extension lines from the alignment marks 36X and 36Y is centered in the reticle R.

In the illumination system of the ISS system of FIG. 1, a light source 31 emits an illumination light IE. The wavelength of the illumination light IE is identical to or close to that of the exposing illumination light IL. The illumination light IE passes through a lens 32 and a light guide 33 and is sent to the bottom of the reference mark member 8 within the Z-stage 4. The illumination light IE emitted from the light guide 33 is collected by a lens 34 and is reflected by a mirror 35 to illuminate the light-emitting marks 9X and 9Y (see FIG. 2) from the underside thereof. The images of the light-emitting marks 9X and 9Y through the projection optical system PL are focused on the reticle R closely to the alignment marks 36X and 36Y provided on the reticle R.

Then driving the Y-stage 5 in the Y-direction by the main control system 30 to detect for example the position of the reticle R in the Y-direction enables the alignment mark 36Y and the light-emitting mark 9Y to be scanned relative to each other. The illumination light LE passing through the alignment mark 36Y is incident to the beam splitter 22 via the mirror 24 and the condenser lens 23. The light reflected by the beam splitter 22 is received by a photoelectric detector 37. The photoelectric signal Si from the photoelectric detector 37 and the position information S2 from the laser interferometers 11X and 11Y are transmitted to an ISS treatment circuit 38. The ISS treatment circuit 38 determines the Y coordinates of the center of the reticle R or the Y coordinates of the Z-stage 4 at the time when the photoelectric signal Si has a maximum value. In order to determine the Y coordinates, the circuit 38 uses a method in which the photoelectric signal Si has a maximum value when the conjugate image of the light-emitting mark 9Y is aligned with the alignment mark 36Y. The circuit 38 then supplies the Y coordinates of the center of the reticle R to the main control system 30.

Similarly, monitoring the photoelectric signal Si from the photoelectric detector 37 and the position information S2 with the alignment mark 36X and the light-emitting mark 9X being scanned relative to each other permits the ISS treatment circuit 38 to detect the X coordinates of the center of the reticle R. The X coordinates of the center thereof are transmitted to the main control system 30. The main control system 30 controls the position of the reticle stage 26 by means of a reticle-driving system (not shown) when it is required to adjust the position of the reticle R.

The projection exposure apparatus according to the preferred embodiment includes an alignment system of an off-axis type in order to detect alignment marks (wafer marks) on the wafer 1. As the detailed construction of the alignment system is disclosed in Japanese Patent Disclosure No. 62-171125 and U.S. Pat. No. 4,962,318, the alignment system will be briefly explained herein. The alignment system comprises an alignment optical system 39 located at the side of the projection optical system PL, an image pick-up element 40 including a two-dimensional CCD and so on, and a signal treatment circuit 41.

The optical axis of the alignment optical system 39 is spaced from the optical axis AX of the projection optical system PL at a predetermined distance. Each of the wafer marks on the wafer 1 is sequentially illuminated by an illumination light including a broad wavelength distribution and a predetermined bandwidth through the alignment optical system 39. The detection center on the wafer 1 of the alignment optical system 39 is aligned with the measurement axis of one of the laser interferometers 11X and 11Y shown in FIG. 2.

The reflected light from the wafer mark on the wafer 1 is incident to the alignment optical system 39 again and the image of the wafer mark is focused on the lower surface of an index plate provided in the alignment optical system 39. The image of the wafer mark and the image of index marks formed on the index plate are focused on an image pick-up surface of the image pick-up element 40 to overlap each other. The image pick-up element 40 is provided in the alignment optical system 39. An image pick-up signal Sf from the image pick-up element 40 and the position information S2 from the laser interferometers 11X and 11Y are supplied to the signal treatment circuit 41. The signal treatment circuit 41 determines the coordinates (X, Y) of the wafer mark and supplies them to the main control system 30. Each of the shot areas of the wafer 1 is positioned on the basis of the coordinates (X, Y) determined as stated in the foregoing.

Next, the construction of an AF sensor (or a focus detection system) of an obliquely incident type included in the projection exposure apparatus will be explained. In the preferred embodiment, the AF sensor of an obliquely incident type comprises an illumination optical system 42, a light receiving system 47, and an AF signal treatment circuit 52. Emitted from a projector 43 in the illumination optical system 42 is a detection light (for example, infrared radiation and the like) having a wavelength in a range which does not sensitize a photosensitive material (a photoresist and the like) which is coated on the wafer 1. The projector 43 includes therein a light-sending slit plate. The detection light passing through a slit of the slit plate, a plane-parallel glass 45, and a collective lens 46 is incident to the wafer 1, and thereby a slit image 7 is projected on the wafer 1. The center of the slit image 7 is positioned on the point at which the optical axis AX of the projection optical system PL and the surface of the wafer 1 cross. In FIG. 1, the plane-parallel glass 45 is located closely to the light-sending slit plate within the projector 43. The plane-parallel glass 45 includes a rotation axis extending in the Y-direction perpendicular to the plane of FIG. 1 and a rotation axis extending in the direction parallel to the plane of FIG. 1 so that the glass 45 can be rotated minutely about each of the rotation axes. A driving portion 44 rotates the plane-parallel glass 45 about each of the two axes within a predetermined angle range. The rotation of the glass 45 permits the measurement point for measuring the focus position or the image position of the slit image 7 to be shifted on the wafer surface substantially in the directions of X and Y along the surface of the wafer 1.

A detection light (or a reflected light) reflected at the measurement point on the wafer 1 is received by a light receiving member 50 through a collective lens 48 and a plane-parallel glass 49 in the light receiving system 47. The light receiving member 50 includes therein a light receiving slit plate. The light passing through a slit of the light receiving slit plate is photoelectrically detected within the light receiving member 50. The plane-parallel glass 49 also includes a rotation axis extending parallel to the Y-direction and the glass 49 can be rotated within a predetermined angle range by a driving portion 51. The rotation of the plane-parallel glass 49 allows a reflected light receiving position in the light receiving member 50 to be adjusted. The direction in which the reflected light receiving position is adjusted is the same as the direction in which the light receiving position is shifted when the wafer 1 is shifted in the Z-direction. The rotation angle of the plane-parallel glass 49 is adjusted so that the light receiving position within the light receiving member 50 is aligned with a detection center of the member 50. The adjustment of the rotation angle of the plane-parallel glass 49 allows the Z-direction position of the measurement point (or the focus position) on the wafer 1 to be aligned with a predetermined reference plane (for example an imaging plane).

Generated by the light receiving member 50 is a focus signal Sa corresponding to a deviation between the focus position of the measurement point on the wafer 1 and the reference plane. The focus signal Sa and the position signal S2 from the laser interferometers 11X and 11Y are supplied to the signal treatment circuit 52. The signal treatment circuit 52 detects the deviation in the Z-direction between the surface of the wafer 1 in the measurement point on the wafer 1 and the reference plane to supply it to the main control system 30. The main control system 30 controls the position of the Z-stage 4 in the Z-direction via the stage-driving system 29 by means of an auto focus system so that the deviation value is zero.

In the AF sensor of an obliquely incident type, the temperature of the gas is adjusted to be constant by a temperature-adjusting portion 60 before flowing along the optical axis AX1 of the illumination optical system 42 and the optical axis AX2 of the light receiving system. The wind velocity distribution of the gas is also made uniform before flowing along the optical axis AX1 and the optical axis AX2. In FIG. 1, the gas the temperature of which is adjusted to be constant by the temperature-adjusting portion 60 is supplied from a gas supplying opening 53 connected to the adjusting portion 60. For example, air, which can be taken easily from the outside of the projection exposure apparatus into the inside thereof, can be used as a gas. Nitrogen, helium, a mixture thereof, or the like may also be used as a gas. A cylinder 54 is arranged in front of the gas supplying opening 53 to surround the optical axis AX1 of the illumination optical system 42. A fan 55 for supplying the gas at a uniform speed is provided close to the front of the gas supplying opening 53. If the gas is supplied from the opening 53 at a substantially uniform speed, the fan 55 is not always necessary.

A filter device 56 for making the wind velocity distribution of the gas uniform is provided behind the fan 55 within the cylinder 54. The filter device 56 comprises a so-called HEPA (High Efficiency Particulate Air) filter for removing fine dust and the like, a so-called chemical filter (for example an activated carbon filter) for removing chemical impurities (ions, organic gases, and so on), and a mechanical filter having a mesh structure for making the wind velocity distribution of the gas passing therethrough uniform. The substantial elements of the illumination optical system 42 are received within the cylinder 54 downstream of the filter device 56. The cylinder 54 includes at the surround thereof a cutout portion 54a. A portion of each of the projector 43 and the driving portion 44 is mounted on the cutout portion 54a of the cylinder 54. Thus, after passing through the filter device 56, the gas 57 having a uniform wind velocity distribution and a predetermined speed is supplied to the wafer 1 along the optical axis AX1 of the illumination optical system 42. The detection light from the projector 43 passes through the gas 57.

The cylinder 58 is arranged to surround the optical axis AX2 of the light receiving system 47. The main elements of the light receiving system 47 are provided within the cylinder 58. The cylinder 58 includes at the surround thereof a cutout portion 58a. A portion of each of the driving portion 51 and the light receiving member 50 is mounted on the cutout portion 58a of the cylinder 58. The alignment optical system 39 is provided close to the opening of the cylinder 58 at the side of the Z-stage 4. The cylinder 58 also includes close to the opening thereof at the side of the Z-stage 4 a cutout portion through which illumination light from the alignment optical system 39 passes. The gas 57 from the cylinder 58 is supplied along the optical axis AX1 of the illumination optical system 42, and passes over the surface of the wafer 1 and the upper surface of the Z-stage 4 to enter the cylinder 58 of the light receiving system 47. The gas passes through the cylinder 58 and is expelled from the opening of the cylinder 58 at the side of the light receiving member 50.

Since the surface of the wafer 1, the surface of the reference mark member 8, and the upper surface of the Z-stage 4 are flush with each other, the gas supplied from the cylinder 54 enters the cylinder 58 without any turbulence being caused. Thus, since the detection light emitted from the projector 43 in the AF sensor of an obliquely incident type passes through the gas having a uniform speed and a uniform wind velocity distribution or the gas having a uniform refractive index distribution, the slit image 7 is focused on the wafer 1 in a proper state and the slit image is also re-focused within the light receiving system 47 in a proper state, thereby enabling the focus position on the wafer 1 to be detected with pinpoint accuracy. Similarly, since the exposing illumination light IL from the projection optical system PL also passes through the gas having a uniform refractive index distribution, the pattern image of the reticle R is projected onto the wafer 1 at high resolution.

In the embodiment, the direction of the projection image to the upper surface of the Z-stage 4, which direction is along the optical axis AX1 of the illumination optical system 42 and the optical axis AX2 of the light receiving system 47, is parallel to the X-axis. As shown in FIG. 2, the laser beam emitted from the laser interferometer 11X illuminates the shift mirror 10X in parallel relation to the X-axis, and the two laser beams emitted from the laser interferometer 11Y illuminate the shift mirror 10Y in perpendicular relation to the X-axis (or in parallel relation to the Y-axis). Thus, the gas supplied from the cylinder 54 to the Z-stage 4 flows in substantially parallel relation to the laser beam emitted from the laser interferometer 11X and in substantially perpendicular relation to the two laser beams emitted from the laser interferometer 11Y, and the laser beams are not effected by the gas with the result that the two-dimensional coordinates (X, Y) of the Z-stage 4 are measured with pinpoint accuracy.

In the alignment system of an off-axis type, since the illumination light emitted from the alignment optical system 39 passes through the gas having a uniform refractive index distribution, the image of the wafer mark is made with high resolution by the alignment optical system 39, thereby allowing the position of the wafer mark to be detected with pinpoint accuracy and the alignment accuracy to be improved. Similarly, the turbulence of the wavefront of the illumination light passing through the reference mark member 8 can also be decreased in the alignment system of the ISS system, thereby allowing the position of the reticle R to be detected with pinpoint accuracy.

In the above embodiment, the gas flows at a uniform speed in the direction from the cylinder 54 to the cylinder 58. However, the cylinder 58 at the side of the light receiving system 47 may be omitted. Even if the cylinder 58 is omitted, the gas having a substantially uniform refractive index distribution flows along the optical axis AX2 of the light receiving system 47, thereby decreasing the turbulence of the focus-detecting luminous flux.

The cylinders 54 and 58 may be omitted. In this case, a gas supplying opening (not shown) is provided in the minus X-direction side of FIG. 1, and the gas the temperature of which is adjusted to be constant is supplied from the opening to the Z-stage 4 at a uniform speed. In such a construction, since the upper surface of the Z-stage 4 is substantially flat, the gas flows without turbulence, thereby allowing the pattern image of the reticle R through the projection optical system PL to be clearly projected onto each of shot areas of the wafer 1. In addition to this, the flat upper surface of the Z-stage 4 also allows turbulence of the focus-detecting luminous flux from the projection 43 and of the illumination light from the alignment optical system 39 to be decreased, and turbulence of the position-measuring laser beam to be decreased.

Figure 3:
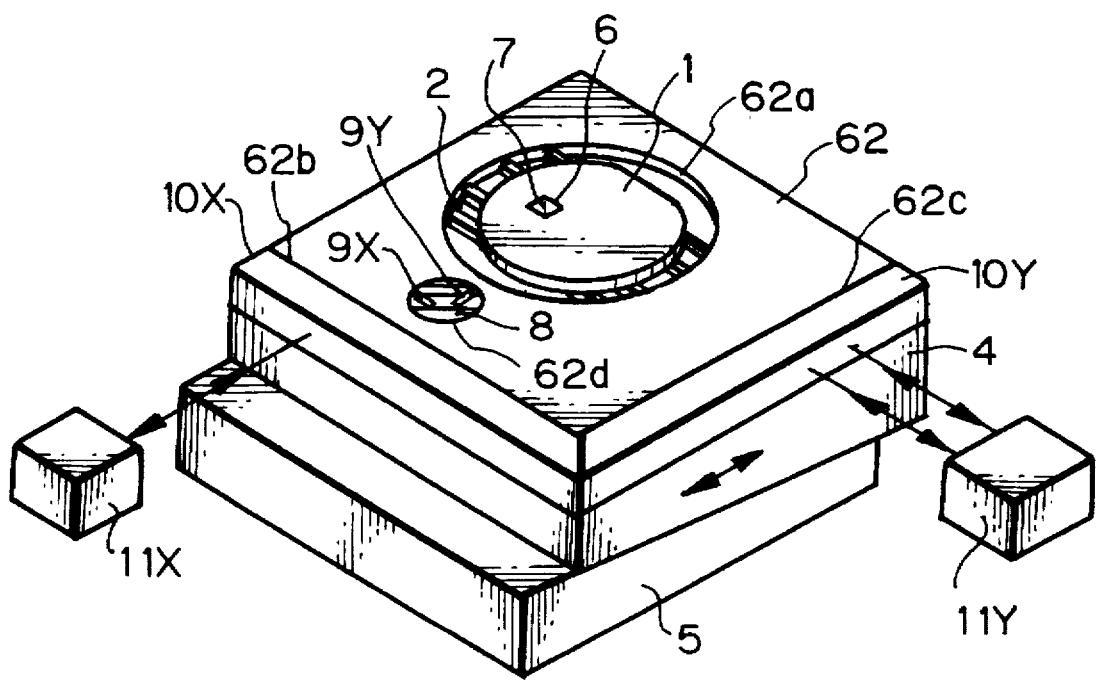
FIG. 3 is a perspective view showing the upper construction of the wafer stage according to another embodiment.
Figure 3:
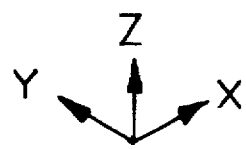

In the above embodiment, the Z-stage 4 is provided with the recesses 4a and 4d and the cutout portions 4b and 4c, and each of the wafer holder 2, the reference mark member 8 and the shift mirrors 10X and 10Y are mounted on the corresponding position of each of the recesses and the cutout portions so that the surface of each of the shift mirrors 10X and 10Y, the reference mark member 8 and the wafer 1 held on the wafer holder 2 is flush with the upper surface of the Z-stage 4. Instead of the above construction, a cover 62 may be mounted on the Z-stage 4 as shown in FIG. 3. In an alternative embodiment, the cover 62 includes an upper flat surface and cutout portions. Each of the cutout portions is arranged at the appropriate portion of the cover facing to the wafer holder 2, the reference mark member 8, and the shift mirrors 10X and 10Y, respectively, and the upper flat surface of the cover 62 is flush with the surface of each of the shift mirrors 10X and 10Y, the reference mark member 8 and the wafer 1 held on the wafer holder 2. This construction also causes a decrease in air flow turbulence.

The present invention can be applied to not only a projection exposure apparatus (for example a stepper) which performs the position of a wafer by a step-and-repeat process but also a projection exposure apparatus (for example see U.S. Pat. No. 5,194,893) which scans a reticle and a wafer relative to a projection optical system to expose a wafer by a step-and-scan process. The application of the invention to an exposure apparatus using a proximity process to make the upper surface of a wafer stage flat enables an improvement in a focussing quality.

In the above embodiment, the AF sensor is used for projecting a slit image onto the wafer. However, as disclosed in for example U.S. application Ser. No. 113,815 filed on Aug. 31, 1993 by the applicant of this application, a so-called multiple point AF sensor may be used which creates a plurality of slit images on a wafer and photoelectrically independently detects each of the slit images to determine points of the slit images on the wafer to detect deviations in a direction of an optical axis between the wafer surface of each of the determined points and a reference plane (for example an image plane of a projection optical system PL).

In the above embodiment, the cut portions are formed on the ends of the Z-stage 4, and the shift mirrors for an interferometer are fitted into the cut portions. However, a Z-stage may be integrally formed with shift mirrors. Namely, two end surfaces of the Z-stage perpendicular to each other may be polished to a mirror-finish to directly form the end surfaces with reflecting surfaces for reflecting laser beams from interferometers.

Thus, the invention is not limited to the above embodiments and a variety of embodiments can be employed within the spirit and scope of the invention.

According to the present invention, since the surface of the photosensitive substrate is substantially flush with the upper surface of the substrate stage surrounding the photosensitive substrate, gas flows above the photosensitive substrate and the substrate stage without any turbulence. Thus, fluctuation of the wavefront of the luminous flux arriving at the photosensitive substrate through the mask pattern is decreased, thereby allowing a satisfactory quality in focussing to be obtained. The illumination of the luminous flux onto the photosensitive substrate from any alignment system such as the AF sensor of an obliquely incident type also causes turbulence of the wavefront of the luminous flux to be decreased, thereby improving accuracy when detecting a focus position and performing an alignment.

Embedding the substrate holder in the Z-stage for positioning the photosensitive substrate in the vertical direction allows the Z-stage to be arranged at the highest step of the substrate stage, thereby simplifying the construction of the substrate stage.

Supplying a gas the temperature of which is adjusted to be constant and the wind velocity distribution of which is made uniform from the gas supplying system to said substrate stage allows a refractive index distribution of the gas above the photosensitive substrate on the substrate stage to be made uniform and be kept at a predetermined constant value, thereby permitting a satisfactory quality in focussing to be maintained.

According to the present invention, since a gas the temperature of which is adjusted to be constant and the wind velocity distribution of which is made uniform is supplied along the optical axis of the illumination optical system included in the focus position detecting system of an obliquely incident type (or the AF sensor), fluctuation of the wavefront of the luminous flux from the illumination optical system is decreased, thereby allowing the focus measuring pattern to be clearly re-focused within the light-receiving system and thus improving accuracy when detecting a focus position.

Supplying by the supplying system a gas the temperature of which is adjusted to be constant and the wind velocity distribution of which is made uniform between the projection optical system and the substrate stage in a direction along the intersection of a plane including the optical axes of the illumination optical system and the light-receiving system and of the upper surface of the substrate stage allows a focussing quality in the projection optical system to be improved.

Providing a cylinder surrounding a portion of the light path of the illumination optical system and supplying the gas from the gas supplying system into the cylinder permits the refractive index distribution of the gas in an area through which the detecting luminous flux passes to be more stable, thereby greatly improving accuracy when detecting a focus position.

What is claimed is:

1. An exposure apparatus comprising:

a substrate holding portion for holding a photosensitive substrate including a surface;

a substrate stage for two-dimensional positioning of said photosensitive substrate via said substrate holding portion, said substrate stage including an upper surface; and an exposure system for transferring a pattern on a mask to said photosensitive substrate by an exposing illumination light, said substrate holding portion being provided in said substrate stage so that the portion of the upper surface of said substrate stage surrounding said photosensitive substrate is substantially flush with the surface of said photosensitive substrate.

2. An exposure apparatus according to claim 1, wherein said substrate holding portion is embedded in the upper surface of said substrate stage.

3. An exposure apparatus according to claim 1, wherein said substrate stage includes an X and Y stage for two-dimensional positioning of said photosensitive substrate and a Z-stage for positioning said photosensitive substrate in a vertical direction, wherein said Z-stage includes an upper surface, and wherein said substrate holding portion is embedded in the upper surface of said Z-stage.

4. An exposure apparatus according to claim 1, wherein said substrate stage includes on the upper surface thereof a recess, and wherein said substrate holding portion is mounted into the recess.

5. An exposure apparatus according to claim 1, wherein said substrate stage includes a substrate stage body and a cover member mounted on the substrate body, wherein said cover member includes a surface for constituting the upper surface of said substrate stage and an opening at the portion thereof facing to said substrate holding portion, wherein said photosensitive substrate is held through the opening of the cover member by said substrate holding portion, and wherein the surface of the cover member is substantially flush with the surface of said photosensitive substrate when said substrate is held by said holding portion.

6. An exposure apparatus according to claim 1, wherein said substrate stage further includes a pair of mirrors for measuring a position of said substrate stage, wherein the mirrors include upper surfaces, and wherein the mirrors are mounted on said substrate stage so that the upper surface of said substrate stage is substantially flush with the upper surfaces of the mirrors.

7. An exposure apparatus according to claim 6, wherein said substrate stage includes cutout portions, and wherein the mirrors are mounted on the cutout portions.

8. An exposure apparatus according to claim 1, wherein said substrate stage includes a reference mark member used for alignment, wherein the reference mark member includes a surface, and wherein the reference mark member is mounted on the substrate stage so that the surface of the reference mark member is substantially flush with the upper surface of said substrate stage.

9. An exposure apparatus according to claim 8, wherein said substrate stage includes a recess on the portion thereof adjacent to said substrate holding portion, and wherein the reference mark member is mounted on the recess of said substrate stage.

10. An exposure apparatus according to claim 1, wherein said substrate stage further includes a pair of mirrors for measuring a position of said substrate stage and a reference mark member used for alignment, wherein the mirrors include upper surfaces, wherein the reference mark member includes a surface, and wherein the mirrors and the reference mark member are mounted on said substrate stage so that the upper surfaces of the mirrors, the surface of the reference mark member, and the upper surface of said substrate stage are substantially flush with each other.

11. An exposure apparatus according to one of claims 1-3, further comprising a gas supplying system for supplying to said substrate stage a gas the temperature of which is adjusted to be constant and the wind velocity distribution of which is made uniform.

12. An exposure apparatus according to claim 1 further comprising a gas supplying device for supplying a gas to said substrate stage, a temperature adjusting device for adjusting the temperature of the gas to be constant, and a device for making the wind velocity distribution of the gas uniform, whereby the gas the temperature of which is adjusted to be constant and the wind velocity distribution of which is made uniform is supplied to said substrate stage.

13. An exposure apparatus according to claim 12 further comprising a first cylinder for conducting the gas supplied from the gas supplying device to said substrate stage.

14. An exposure apparatus according to claim 13 further comprising a second cylinder for conducting the gas passing over said substrate stage away from said substrate stage.

* * * * *

UNITED STATES PATENT AND TRADEMARK OFFICE
CERTIFICATE OF CORRECTION

PATENT NO.:   5,633,698
DATED     :   May 27, 1997
INVENTOR(S):  Yuji IMAI

It is certified that error appears in the above-identified patent and that said Letters Patent is hereby corrected as shown below:

On the title page item [73] the Assignee, is incorrect. Please change "Nixon Corporation" to be --Nikon Corporation-- therefor.

Signed and Sealed this

Seventh Day of October, 1997

Attest:

BRUCE LEHMAN

Attesting Officer

Commissioner of Patents and Trademarks